US006291849B1

(12) United States Patent
Figura

(10) Patent No.: US 6,291,849 B1
(45) Date of Patent: *Sep. 18, 2001

(54) SEMICONDUCTOR STRUCTURES AND APPARATUS HAVING SEPARATED POLYSILICON GRAINS

(75) Inventor: Thomas A. Figura, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/388,561

(22) Filed: Sep. 2, 1999

Related U.S. Application Data

(62) Division of application No. 09/257,899, filed on Feb. 25, 1999, which is a continuation of application No. 08/724,981, filed on Oct. 3, 1996, now Pat. No. 5,972,771, which is a continuation of application No. 08/209,661, filed on Mar. 11, 1994, now abandoned.

(51) Int. Cl.⁷ .......................... H01L 27/108; H01L 29/76
(52) U.S. Cl. ........................ 257/306; 257/309; 257/303
(58) Field of Search .......................... 257/309; 438/255, 438/398, 665, 964; 361/303, 305

(56) References Cited

U.S. PATENT DOCUMENTS

| 5,130,885 | * | 7/1992 | Fazan et al. .................... 361/313 |
| 5,134,086 | | 7/1992 | Ahn .................................. 437/52 |
| 5,162,248 | | 11/1992 | Dennison et al. ................. 437/52 |
| 5,170,233 | | 12/1992 | Liu et al. . | |
| 5,227,322 | | 7/1993 | Ko et al. . | |
| 5,256,587 | * | 10/1993 | Jun et al. ........................ 437/52 |
| 5,278,091 | | 1/1994 | Fazan et al. ..................... 437/52 |
| 5,304,828 | * | 4/1994 | Kim et al. ....................... 257/309 |
| 5,318,920 | | 6/1994 | Hayashide ..................... 437/977 X |
| 5,340,765 | | 8/1994 | Dennison et al. ................. 437/52 |
| 5,342,800 | | 8/1994 | Jun . | |
| 5,350,707 | | 9/1994 | Ko et al. ...................... 437/919 X |
| 5,366,917 | | 11/1994 | Watanabe et al. .................. 437/47 |
| 5,372,962 | | 12/1994 | Hirota et al. .................. 437/977 X |

(List continued on next page.)

FOREIGN PATENT DOCUMENTS 04280669  10/1992  (JP) .
05315543  11/1993  (JP) .

OTHER PUBLICATIONS

Vemoto, et al., "IEEE Symposium on VLSI Technology", 21–22, (1990).
Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Primary Examiner—Minh Loan Tran
(74) Attorney, Agent, or Firm—Schwegman, Lundberg, Woessner & Kluth, P.A.

(57) ABSTRACT

A method for forming HSG polysilicon with reduced dielectric bridging and increased capacitance. A first polysilicon layer is deposited and doped with impurities to increase conductivity. A second polysilicon layer is deposited at a reduced temperature to cause a nucleation of the second polysilicon layer. Grains are formed on the surface of the second polysilicon layer as a result of the nucleation. Next a wet etch is performed to remove portions of the polysilicon grains and portions of the first polysilicon layer. The duration of the wet etch is controlled to retain a roughened surface area. The size of the grains decreases during the wet etch and the distance between the grains increases. A dielectric layer is deposited to overlie the rough polysilicon following the wet etch. The thickness of the dielectric layer tends to be uniform thereby reducing bridging of the dielectric between the grains of the of the polysilicon.

54 Claims, 11 Drawing Sheets

U.S. PATENT DOCUMENTS

| | | | |
|---|---|---|---|
| 5,385,863 | 1/1995 | Tatsumi et al. | |
| 5,405,801 | 4/1995 | Han et al. | 437/60 |
| 5,407,534 | 4/1995 | Thakur | 156/662 |
| 5,480,826 | 1/1996 | Sugahara et al. | 437/52 |
| 5,597,754 | 1/1997 | Lou et al. | 437/52 |
| 5,623,243 * | 4/1997 | Watanabe et al. | 257/309 |
| 5,696,014 * | 12/1997 | Figura | 438/398 |
| 5,872,033 * | 2/1999 | Figura | 438/255 |
| 5,877,063 | 3/1999 | Gilchrist et al. | 438/398 |
| 5,933,727 * | 8/1999 | Figura | 438/255 |
| 5,972,771 * | 10/1999 | Figura | 438/398 |

* cited by examiner

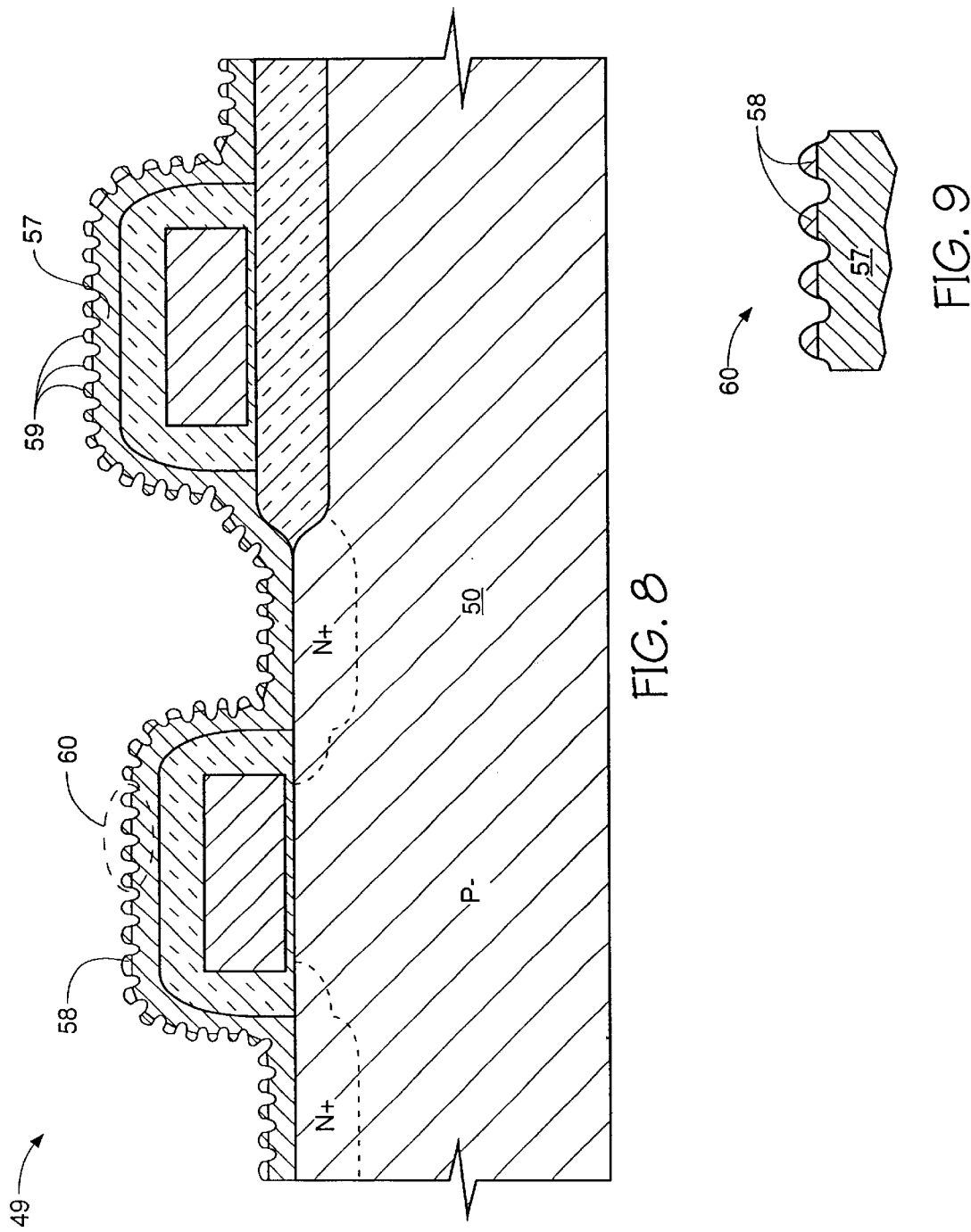

SEMICONDUCTOR STRUCTURES AND APPARATUS HAVING SEPARATED POLYSILICON GRAINS

CROSS REFERENCE TO RELATED APPLICATIONS

This application is a divisional of U.S. Ser. No. 09/257,899, filed Feb. 25, 1999, which is a continuation of U.S. Ser. No. 08/724,981, filed Oct. 3, 1996, now U.S. Pat. No. 5,972,771, which is a continuation of U.S. Ser. No. 08/209,661, filed Mar. 11, 1994, now abandoned.

FIELD OF THE INVENTION

This invention relates to semiconductor technology and, more specifically, to the design of capacitors used in dynamic random access memory cells.

BACKGROUND OF THE INVENTION

The invention uses various materials which are electrically either conductive, insulative or semi-conductive, although the completed circuit device itself is usually referred to as a "semiconductor."

The memory cells of dynamic random access memories (DRAMs) are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are ford from an etched polycrystalline silicon layer. Bit line 15 connects with access-node junction 16. Capacitor 11 has a lower plate formed from the n+ silicon substrate extension 17 of storage node junction 18 of FET 12. Upper capacitor plate (or field plate) 19 is formed from a layer of conductively-doped polycrystalline silicon. Substrate extension 17 is electrically insulated from upper plate 19 by a dielectric layer 20. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, as cell capacitance is reduced, the sense-amp differential signal is reduced. This aggravates noise sensitivity and makes it more difficult to design a sense-amp having appropriate signal selectivity. Thirdly, as cell capacitance is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

One three-dimensional technique involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The lower plate 22 may be formed from the n+ doped silicon substrate or it may be formed from a polysilicon layer which lines a trench cut in the n+ doped silicon substrate. The upper plate 23 is formed from a layer of conductively-doped polycrystalline silicon (poly). Lower plate 22 and upper plate 23 are electrically insulated from each other with a dielectric layer 24. DRAM chips employing trench capacitors have been built by a number of European, Japanese and U.S. companies, including IBM Corporation, Texas Instruments, Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by most DRAM manufactures including, Micron Semiconductor, Nippon Electric Co W, Samsung, Goldstar, Hyundai, Mitsubishi Electric Corporation, Hitachi, and Fujitsu, Ltd., is the stacking of capacitor plates between dielectric layers on the DRAM cell surface. FIG. 3 is a graphic representation of a typical DRAM cell having a stacked capacitor 31. The lower plate 32 is formed from an n-type polycrystalline silicon layer which is in contact with the silicon substrate 33 in the region of the FET storage node junction, while the upper plate. 34 is formed from a conductively-doped polycrystalline silicon layer. The two layers are separated by a dielectric layer 35. Lower or storage node plate 32 and upper plate 34 are both stacked on top of FET 12 and word line 36, resulting in a high-profile cell which requires more stringent process control for the connection of bit line 37 to access-node junction 38.

In one variation of the stacked capacitor, which is currently being used by National Electric Company, Micron, Samsung, Matsushita, and other DRAM manufacturers, the storage node plate of the stacked capacitor is a rough polysilicon layer called hemispherical grain (HSG) polysilicon. This layer is formed at a critical temperature and pressure at which an anomalous nucleation occurs, causing the surface to roughen. The HSG polysilicon provides a much larger surface area than planar poly. However the benefits of HSG polysilicon are not fully utilized because the grains, as shown in an enlarged exaggerated cross-sectional view in FIG. 4 of deposited HSG polysilicon 47, are so close together that the dielectric layer 48 deposited to overlie the HSG polysilicon 47 bridges between the grains. The dielectric layer 48 in the bridged area is often as thick as 400 angstroms. Therefore a method is needed to reduce the bridging of the dielectric 48 between the grains of the HSG polysilicon 47 while maintaining the increased capacitive area provided by the HSG polysilicon 47.

SUMMARY OF THE INVENTION

The present invention is applicable to DRAM cell designs, such as the stacked capacitor design heretofore described or a poly-lined trench design, that utilize a conductively-doped polycrystalline layer for the storage node, or lower capacitor plate. The invention is a method for forming HSG polysilicon with reduced dielectric bridging. A doped first polysilicon layer is deposited. A second polysilicon layer is then deposited to overlie the first polysilicon layer. The temperature and pressure of the second polysilicon layer is selected in a range wherein HSG is formed during the deposition. Thus the surface of the second polysilicon layer is roughened as a result of nucleation. Next a wet etch is performed. The aggressiveness of the wet etch is controlled to remove portions of the rough polysilicon and portions of the base polysilicon while retaining a roughened surface and maintaining a large surface area of the storage node capacitor plate. The size of the grains decreases during the wet etch and the distance between the grains increases. A dielectric layer is deposited to overlie the rough polysilicon following the wet etch. Bridging of the dielectric is reduced resulting in the dielectric layer having a uniform thickness over the entire surface of the storage node capacitor plate. Since bridging is reduced the thickness of the dielectric layer in areas formerly bridged is reduced and capacitance is increased.

BRIEF DESCRIPTIGN OF THE DRAWINGS

FIG. 1 is a cross-sectional view of a DRAM cell having a conventional planar capacitor of the related art.

FIG. 2 a cross-sectional view of a DRAM cell having a typical trench capacitor of the related at FIG. 3 is a cross-sectional view of a DRAM cell having a typical stacked capacitor of the related art.

FIG. 8 is a cross-sectional view of the DRAM cell of FIG. 6 following a wet etch.

FIG. 9 is an exaggerated enlarged cross-sectional view of a portion of the nucleated polysilicon layer of FIG. 8.

Figure 15:
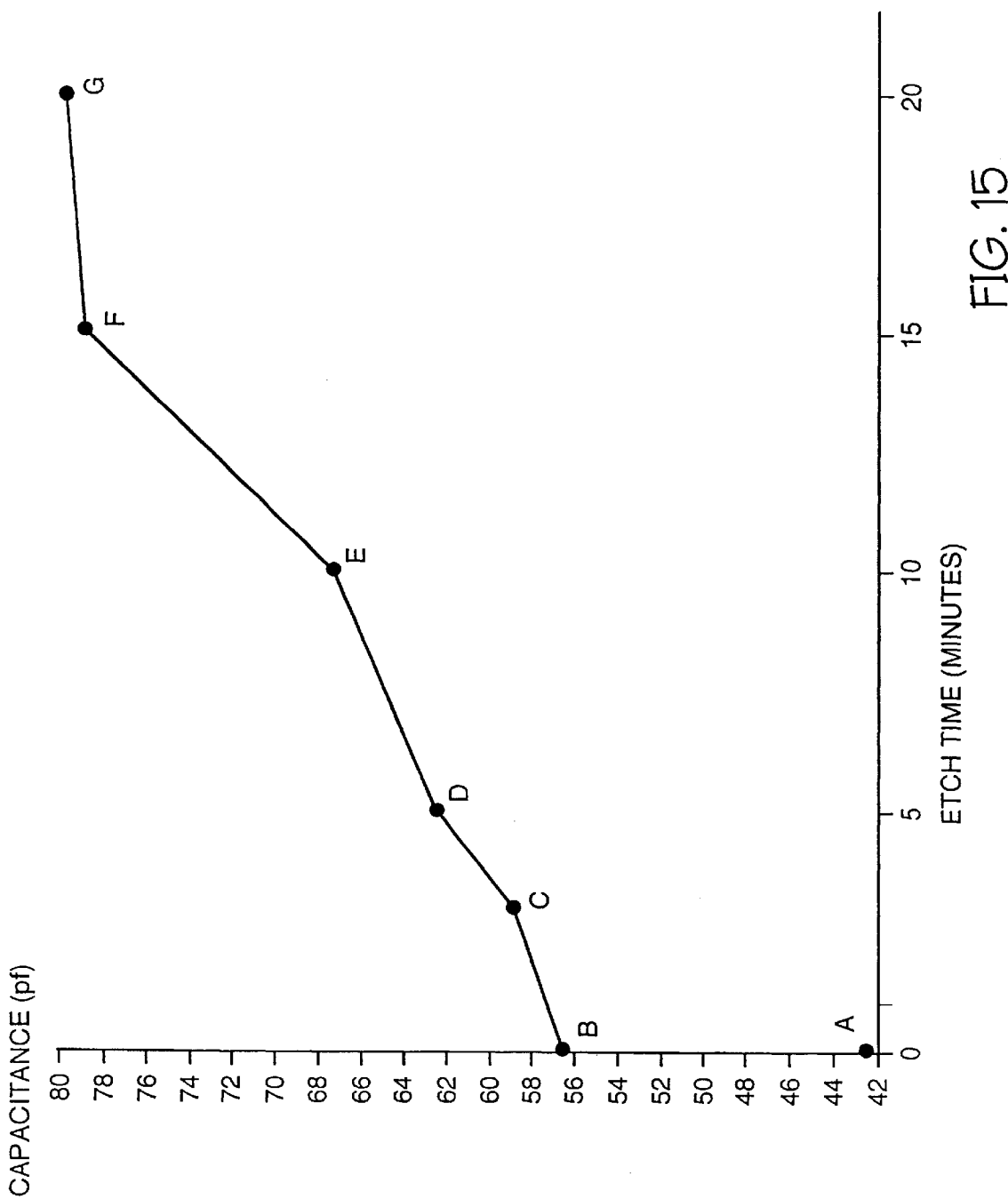

FIG. 15 a graph depicting capacitance data.

DETAILED DESCRIPTION OF THE PREFERRED EMBODIMENT

Figure 1:
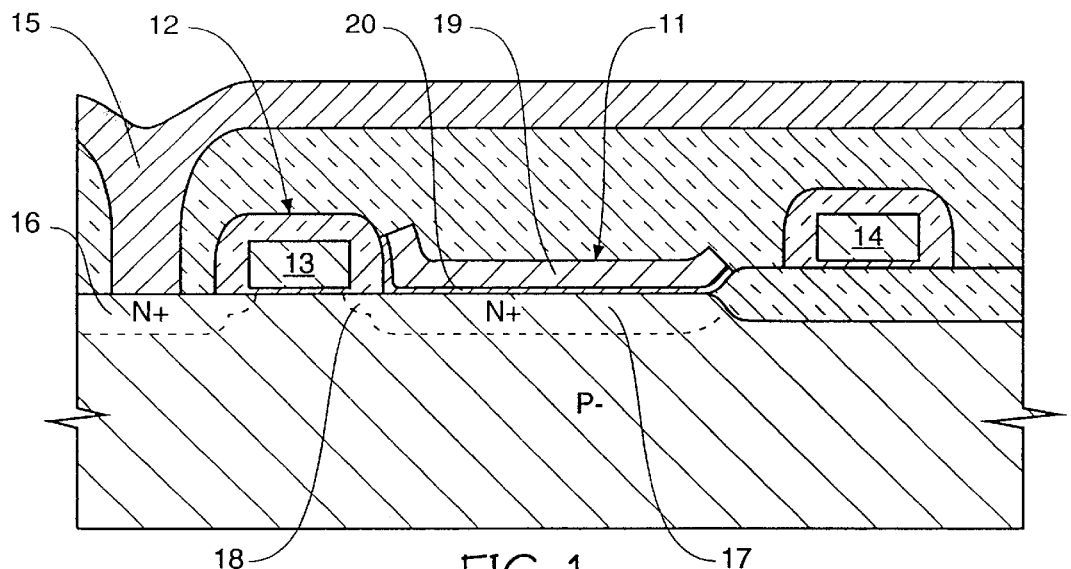
Figure 2:
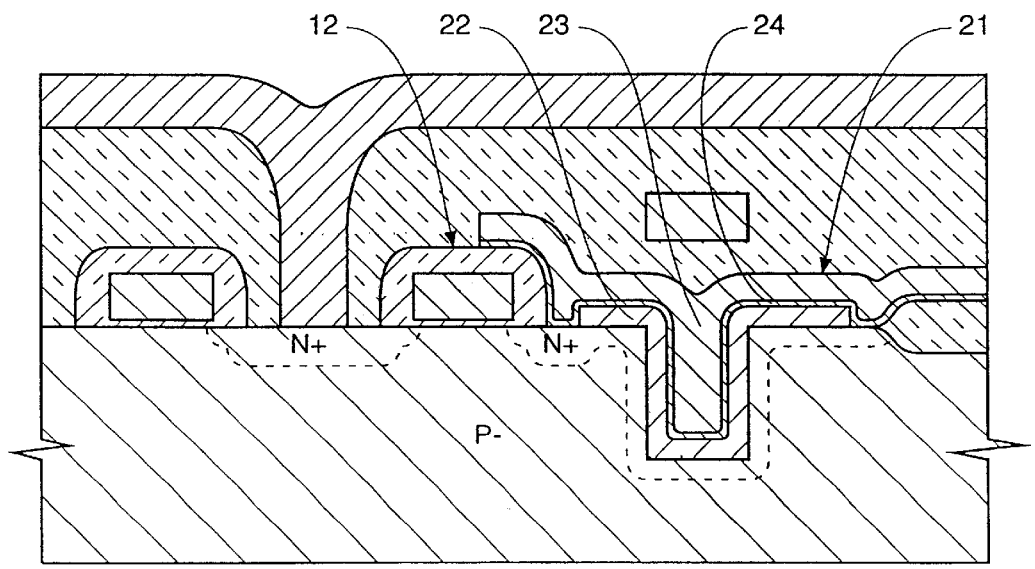
Figure 3:
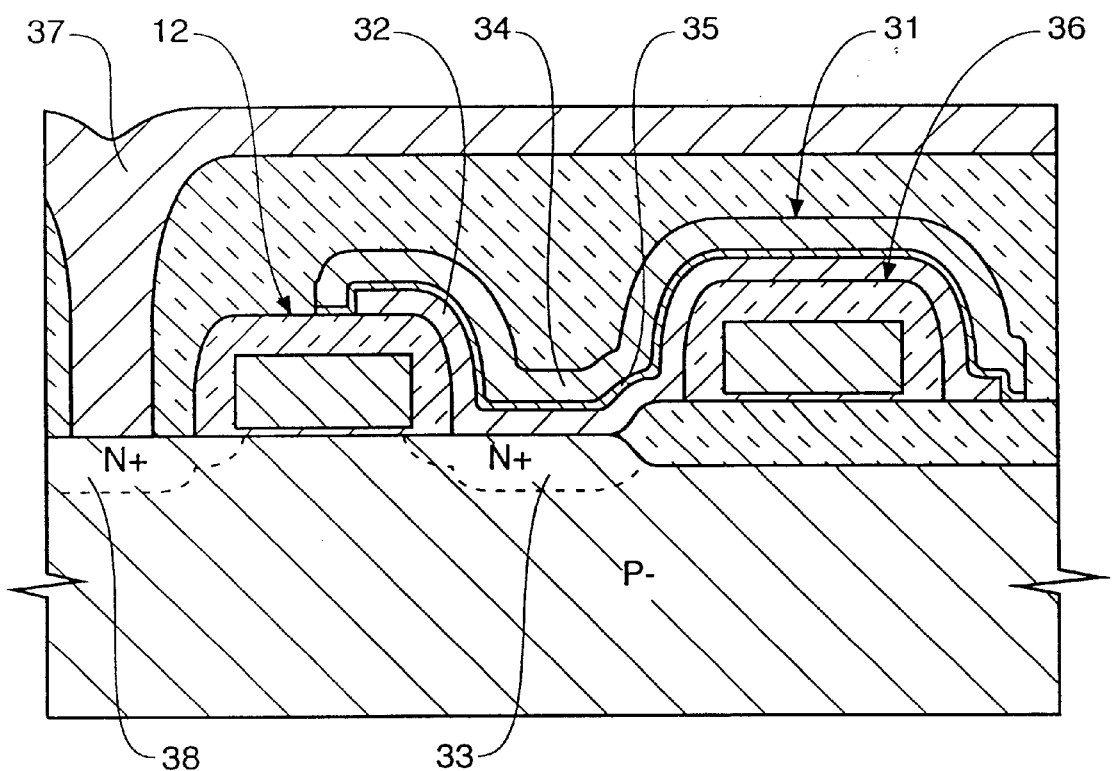
Figure 4:
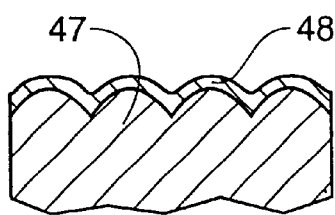
FIG. 4 is an exaggerated enlarged cross-sectional view of a DRAM storage node capacitor plate and dielectric layer of the related art.
Figure 5:
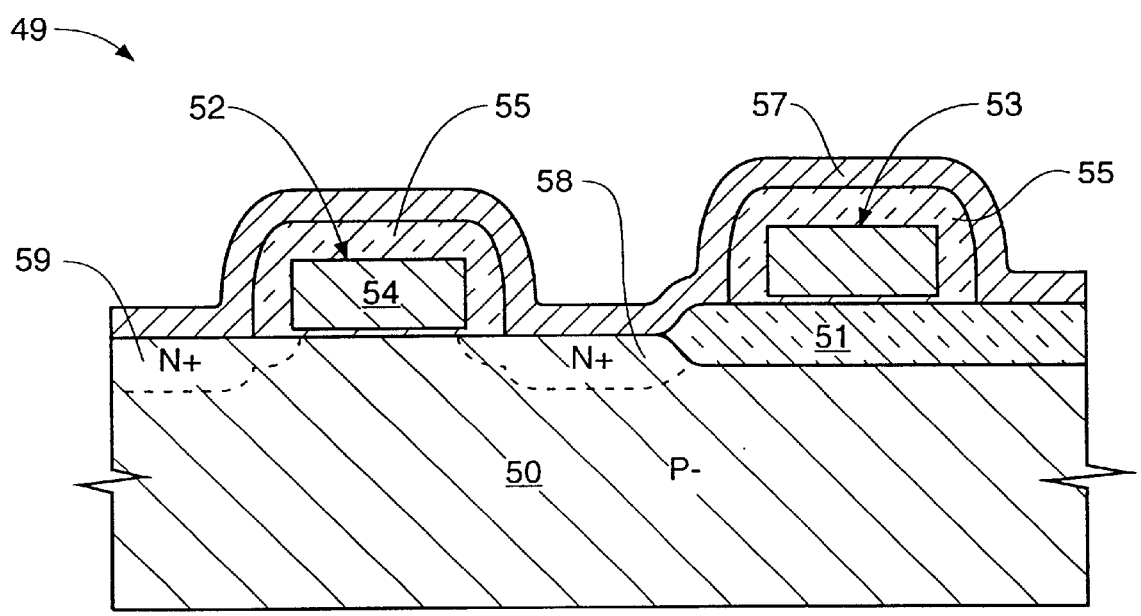
FIG. 5 is a cross-sectional view of a DRAM cell of a stacked capacitor of the invention during the fabrication process subsequent to the deposition of the storage node base polysilicon layer.

The invention is a method for forming a storage node capacitor. In FIG. 5, a Dram cell 49 of stacked capacitor design is shown during the early stages of the fabrication process. The storage node stacked capacitor of the invention is fabricated to overlie a wafer substrate 50 of intrinsic polycrystalline silicon and to overlie a field oxide region 51 of the substrate 50. The cell's field-effect transistor (FET) 52 and wordline 53 have already been formed. The FET gate 54 and wordline 53 are covered on the top and sides by a silicon oxide spacer layer or nitride spacer layer 55. A first or base polysilicon layer 57 is deposited over the FET 52, the word line 53, the storage node junction 81, and the access node junction 79. The polysilicon layer 57 is then doped with phosphorus or other similar dopant to produce an extrinsic conductive polysilicon layer.

Figures 6, 7:
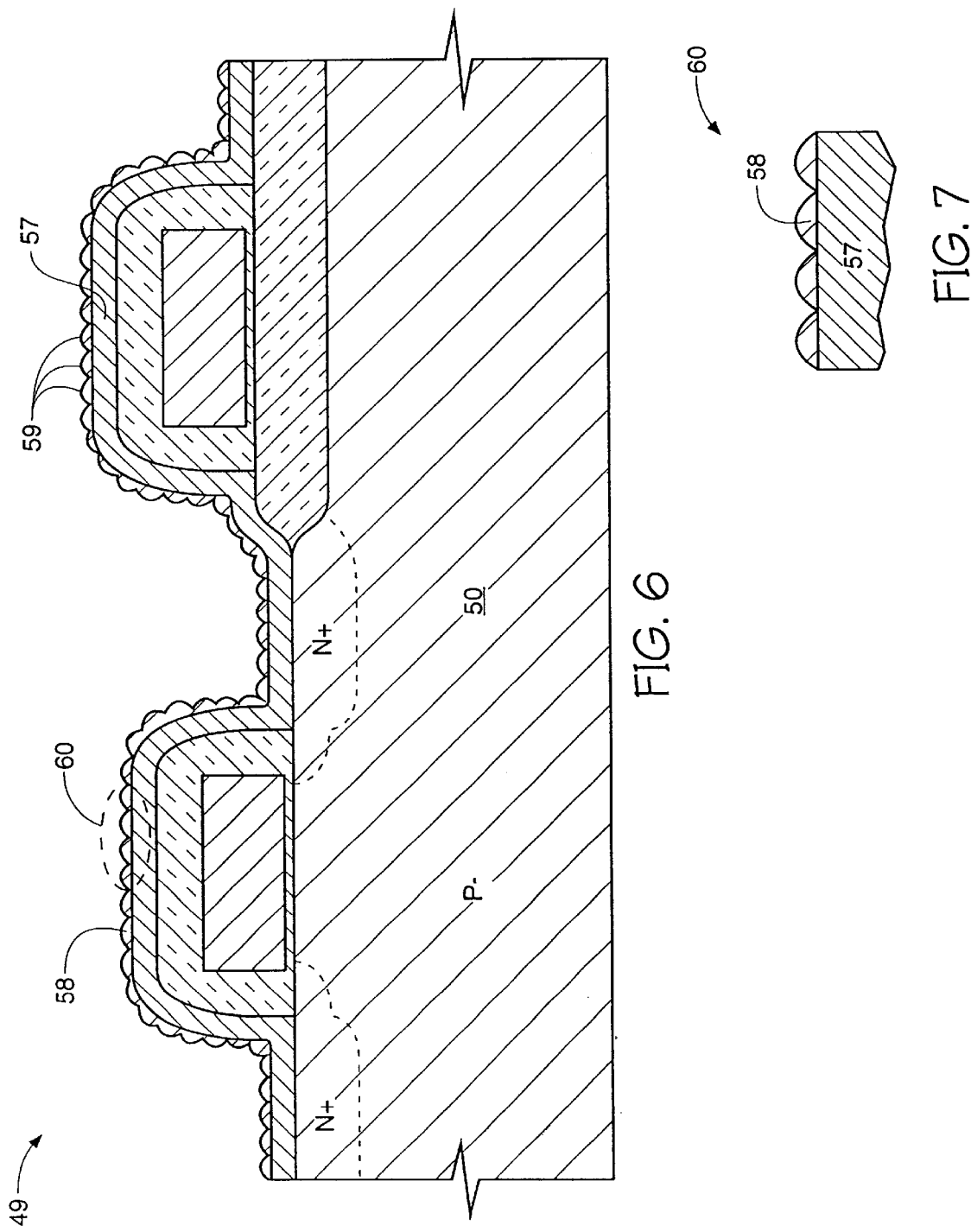
FIG. 6 is a cross-sectional view of the DRAM cell of FIG. 5 following HSG polysilicon formation on the storage node base polysilicon layer.
FIG. 7 is an exaggerated enlarged cross-sectional view of a portion of the nucleated polysilicon layer of FIG. 6.

Referring now to FIG. 6, a second polysilicon layer 58 is deposited. The pressure and temperature during the deposition of the second polysilicon layer 58 is selected to induce nucleation thereby forming hemispherical grains 59 of polysilicon. The nucleated second polysilicon layer is called hemispherical grain (HSG) polysilicon. The first 57 and second 58 polysilicon layers form the storage node capacitor plate of the storage node capacitor of the invention.

In an alternate method the HSG polysilicon is formed according to the following process developed by Nippon Electric Company called vacuum anneal. In this process only one layer of doped or undoped amorphous or polycrystaline silicon is deposited. The layer is subjected to a tightly controlled temperature and pressure to induce nucleation and form a rough surface.

FIG. 7 is an exaggerated enlarged cross-sectional view of a portion 60 of FIG. 6. Although the actual grains 59 may not be perfectly hemispherical as depicted in FIG. 7 they are configured similar to the exaggerated view of FIG. 7 and they tend to intersect one another at the surface of the first polysilicon layer 57.

FIG. 8 is the DRAM cell of FIG. 6 following a wet etch. The wet etch can be either an oxide etch or a polysilicon etch. The etch removes portions of the grains 59 and portions of the first polysilicon silicon layer 57. The size of the grains 59 decreases during the wet etch and the distance between the grains 59 increases. By controlling the aggressiveness of the wet etch the large roughened surface area of the HSG polysilicon layer 58 is not only maintained it is enhanced thereby increasing the surface area of the storage node capacitor plate.

FIG. 9 is the exaggerated enlarged cross-sectional view of a portion 60 of FIG. 8 depicting the smaller grains of second polysilicon layer 58 and the increased distance between the grains 59 following the wet etch.

Figure 10:
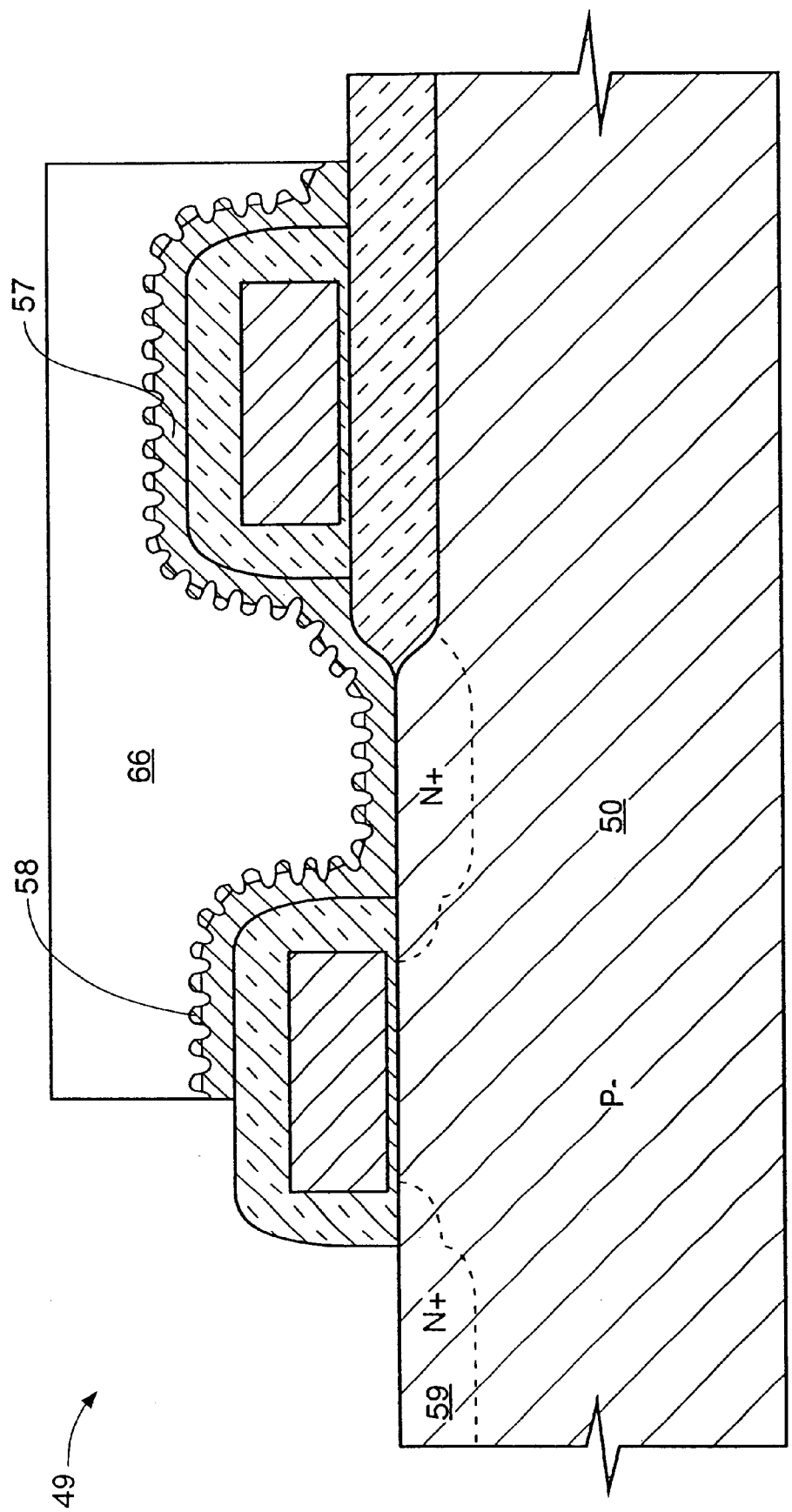
FIG. 10 is a cross-sectional view of the DRAM cell of FIG. 8 following the masking and etching of the base polysilicon layer and the HSG polysilicon layer.

In FIG. 10 the first polysilicon layer 57 and the second polysilicon layer 58 are masked with mask 66 and etched in unmasked regions to define the storage node capacitor plate comprising first and second polysilicon layers 57 and 58.

In an alternate embodiment it is equally effective to perform the wet etch after the masking, etching and subsequent mask removal in order to form the storage node portion having smaller grains and an increased distance between the grains.

Figure 11:
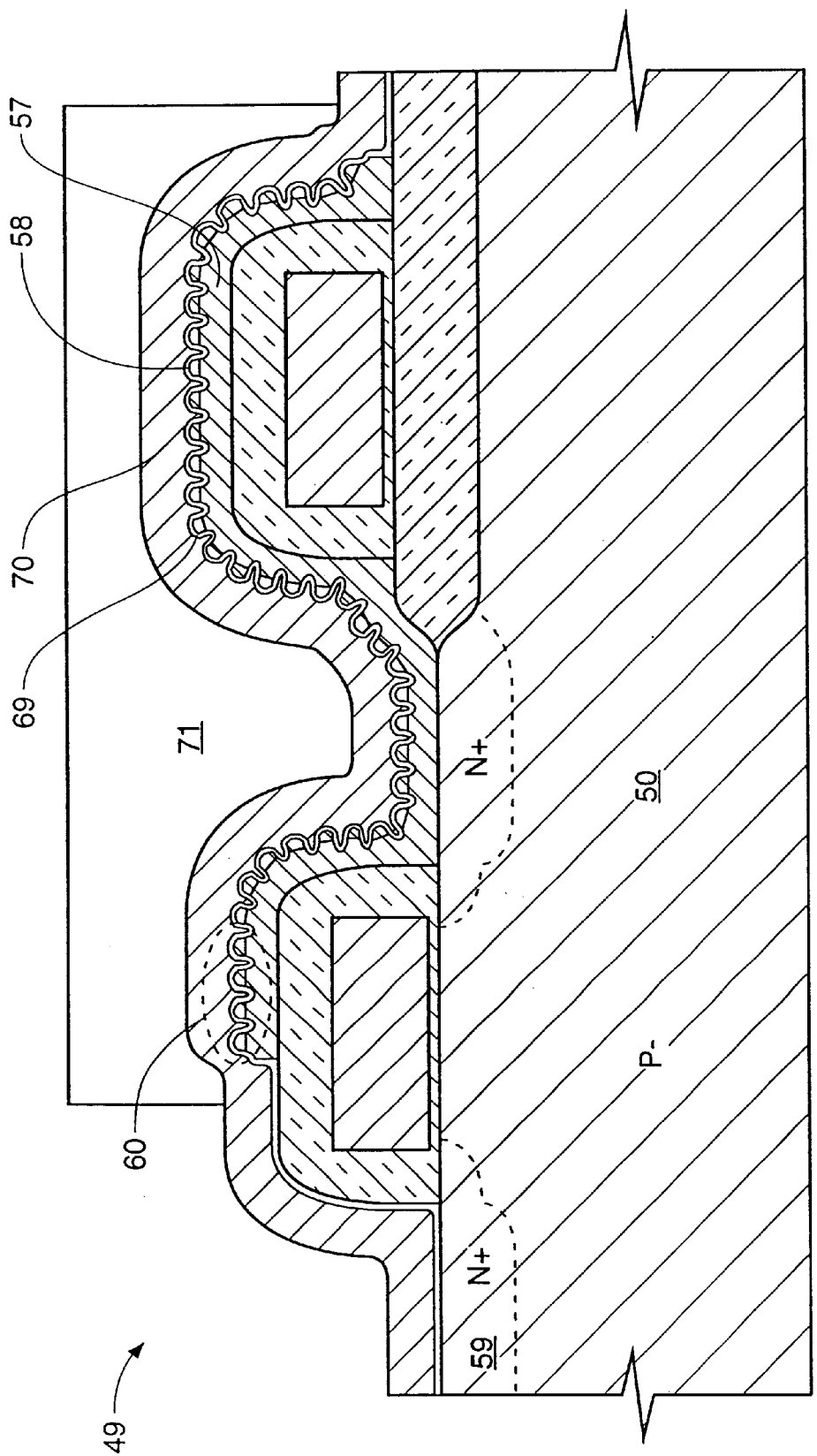
FIG. 11 is a cross-sectional view of the DRAM cell of FIG. 10 following the blanket deposition of a dielectric layer, the blanket deposition of a polysilicon cell plate layer, and the masking of the cell plate layer.

In FIG. 11 a dielectric layer 69 having good step coverage is deposited to overlie first 57 and second 58 polysilicon layers. Typically the dielectric layer 69 is silicon nitride having a thickness of approximately 80 Angstroms, although other dielectric materials and thicknesses may be used. Due to the decreased size of the grains 59 and the increased distance between the grains 59, the thickness of the dielectric layer 69 is approximately uniform. The dielectric deposition is followed by the blanket deposition of a polysilicon cell plate layer 70, the conductive doping of cell plate layer 70 with phosphorus or other similar dopant, and the masking of the cell plate layer 70 with photomask 71.

Figure 12:
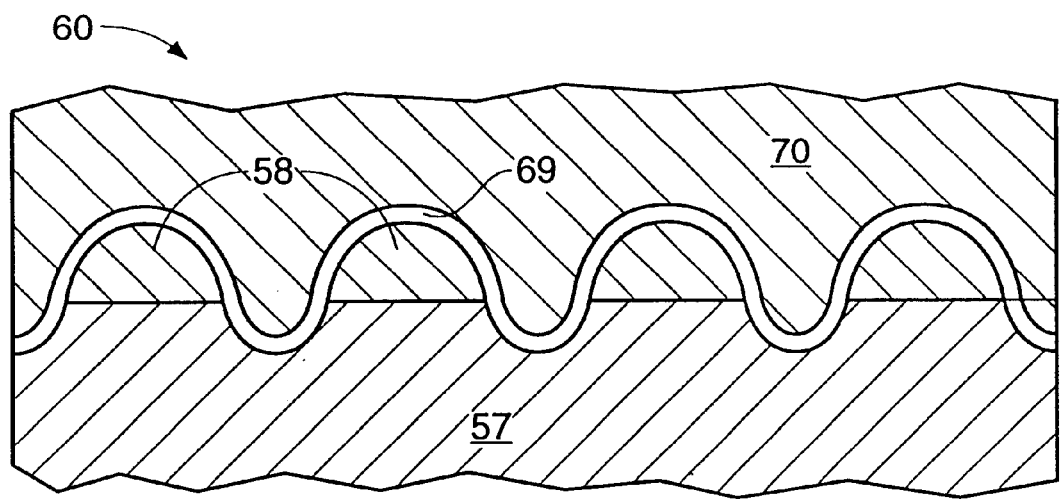
FIG. 12 is an exaggerated enlarged cross-sectional view of a portion of the DRAM cell of FIG. 11.

FIG. 12 is the exaggerated enlarged cross-section of portion 60 of FIG. 11. It can be seen that the thickness of the dielectric layer 69 is uniform, in this example 80 angstroms, over 100% of the surface of the second polysilicon layer 58 and over 100% of the surface of exposed portions of the first polysilicon layer 57.

Figure 13:
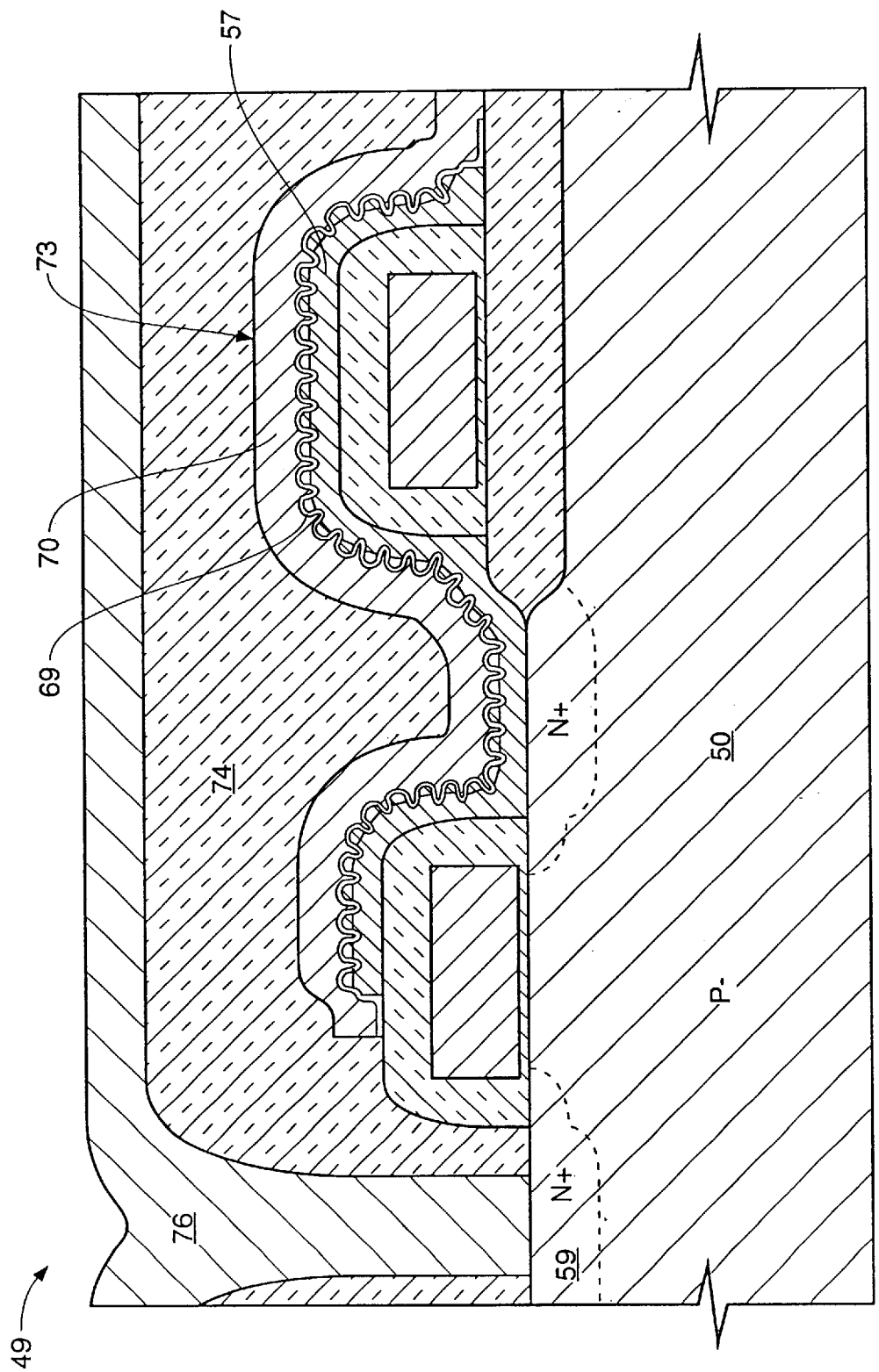
FIG. 13 is a cross-sectional view of the DRAM cell of FIG. 11 following the etching of the polysilicon cell plate layer and the formation of a bit line.

Referring now to FIG. 13, cell plate layer 70 and dielectric layer 69 have been etched forming the stacked capacitor of the invention. The process is completed with a conformal deposition of oxide 74 etched to expose access node junction 79. A bit line 76 is then deposited and patterned to contact the access node junction 59.

Figure 14:
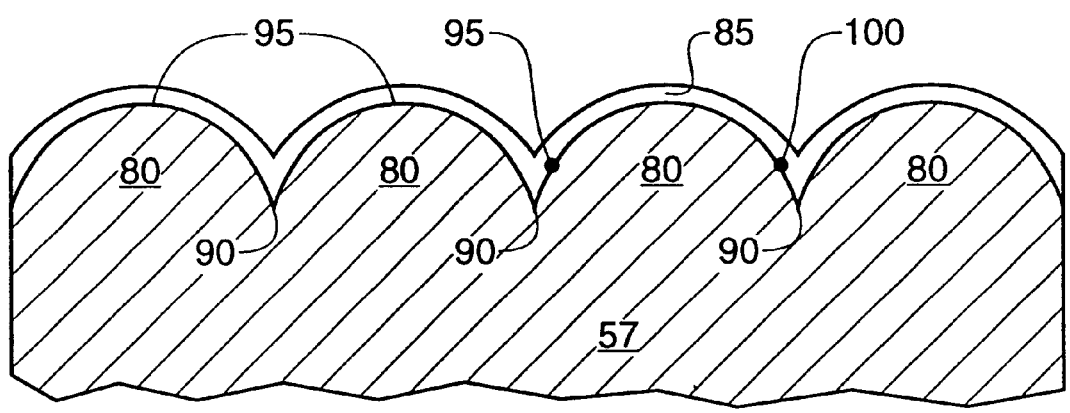
FIG. 14 is an exaggerated enlarged cross-sectional view of an HSG layer of the related art following a deposition of a dielectric layer.

FIG. 14 is a depiction of the related art and is provided in order that the storage node capacitor plate and dielectric layer of the invention, as shown in FIG. 12, can ,be compared to a storage node capacitor plate and dielectric formed without the wet etch of the present invention. FIG. 14 is an exaggerated enlarged cross-section of an unetched HSG polysilicon layer 80 with an overlying dielectric layer 85. Even though the minimum thickness of the dielectric layer 85 is 80 angstroms, as is the dielectric layer 69 shown in FIG. 12, the dielectric bridges over the intersections 90. Therefore the dielectric interposed between two adjacent grains 95 is much thicker than 80 Angstroms. This results is less surface area being covered by dielectric having the minimum thickness. The distance covered by the dielectric 85 having minimum thickness is represented by the surface of the HSG polysilicon 80 interposed between points 96 and 100.

Thus by using the method of the invention the percentage of the surface area covered by a minimum thickness of dielectric can reach 100%. In some instances this 100% coverage is a 38% increase over methods which do not employ the wet etch of the invention. Therefore by using the method of the invention capacitance can be increased by at least between 10% and 50%.

FIG. 15 is a graph showing the relationship between capacitance and etch time. The etch time is measured in minutes and the capacitance is measured in pico farads. The capacitance of each point A–G was calculated by averaging the results obtained on 10 different capacitors, each capacitor having an area of 6400 square microns. All possible variables such as size of the storage node plate, size of the cell plate and thickness of the dielectric were held constant throughout the experiment. Point A shows that the capacitance of a capacitor comprising a doped polysilicon layer without an overlying HSG layer as the storage node plate is between 42 and 43 pico farads. Points B–G show the capacitance of a capacitor having a doped polysilicon layer and overlying HSG layer as the storage node plate. At point B where the HSG was not etched the capacitance is between 56 and 57 pico farads. Capacitance increases as etch time for etching the HSG layer increases and starts to level off at point F after 15 minutes of etching. At point F the capacitance is between 78 and 79 pico farads, although data was not obtained for capacitors having etch times between 10 and 15 minutes. Over etching that reduces the roughness of the HSG layer could eventually reduce the capacitance to the range of capacitance experienced when no HSG layer is provided. Therefore the etch must be controlled to optimize capacitance.

The invention may also be implemented wherein the stacked capacitor is fabricated overlaying the bit lines or for other types of capacitors, such as trench. Monocrystalline silicon may also be used in place of polycrystalline.

By decreasing the size of the grains and increasing the distance between them during the wet etch the maximum thickness of the dielectric layer is decreased thereby increasing capacitance.

Although the invention has been described in terms of one method for masking and forming a stacked capacitor the invention is equally applicable for any method of forming a capacitor comprising wet etching a nucleated polysilicon layer.

Although only a single embodiment of the invention has been described herein, it will be apparent to one skilled in the art that changes and modifications may be made thereto without departing from the spirit and the scope of the invention as claimed.

What is claimed is:

1. A roughened silicon surface on a substrate, comprising
   a first silicon layer having depressions; and
   a second silicon layer having a plurality of polysilicon grains separated by a distance from adjacent grains and supported by the first silicon layer.

2. The roughened silicon surface of claim 1, wherein the first and second silicon layers are formed as a single silicon layer.

3. The roughened silicon surface of claim 1, wherein the first silicon layer comprises a silicon material selected from the group consisting of undoped amorphous silicon, doped amorphous silicon, undoped polysilicon and doped polysilicon.

4. The roughened silicon surface of claim 1, wherein the polysilicon grains comprise hemispherical polysilicon grains.

5. A roughened silicon surface on a substrate, comprising:
   a first silicon layer having depressions; and
   a second silicon layer having a plurality of polysilicon grains separated by a distance from adjacent grains and supported by the first silicon layer wherein the first silicon layer is conductively doped.

6. The roughened silicon surface of claim 5, wherein the first and second silicon layers are formed as a single silicon layer.

7. The roughened silicon surface of claim 5, wherein the first silicon layer comprises a silicon material selected from the group consisting of undoped amorphous silicon, doped amorphous silicon, undoped polysilicon and doped polysilicon.

8. The roughened silicon surface of claim 5, wherein the polysilicon grains comprise hemispherical polysilicon grains.

9. A roughened polysilicon surface on a substrate, comprising:
   a first polysilicon having depressions; ant
   a second polysilicon layer having a plurality of grains separated by a distance from adjacent grains and supported by the first polysilicon layer wherein at least one of the first and second polysilicon layers is conductively doped.

10. The roughened polysilicon surface of claim 9, wherein the first and second polysilicon layers are formed as a single polysilicon layer.

11. The roughened silicon surface of claim 9, wherein the first and second polysilicon layers are formed as a single polysilicon layer.

12. A roughened polysilicon surface on a substrate, comprising:
   a first polysilicon layer having depressions; and
   a second polysilicon layer having a plurality of grains separated by a distance from adjacent grains and supported by the first polysilicon layer wherein the first polysilicon layer is conductively doped.

13. A roughened silicon surface on a substrate, comprising:
   a first silicon layer having depressions comprising a silicon material selected from the group consisting of doped amorphous silicon and doped polysilicon; and
   a second silicon layer having a plurality of polysilicon grains separated by a distance from adjacent grains and supported by the first silicon layer.

14. The roughened silicon surface of claim 13, wherein the first and second polysilicon layers are formed as a single polysilicon layer.

15. A roughened silicon surface on a substrate, comprising:
   a first silicon layer comprising a silicon material selected from the group consisting of doped amorphous silicon and doped polysilicon; and
   a second silicon layer having a plurality of polysilicon grains separated by a distance from adjacent grains and supported by the first silicon layer;
   wherein the first silicon layer further comprises depressions formed between the grains of the second silicon layer.

16. A roughened polysilicon surface on a substrate, comprising:
   a first polysilicon layer having depressions comprising a conductively-doped polysilicon material; and
   a second polysilicon layer having a plurality of polysilicon grains separated by a distance from adjacent grains and supported by the first polysilicon layer.

17. A roughened polysilicon surface on a substrate, comprising:
   a first polysilicon layer comprising a conductively-doped polysilicon material; and
   a second polysilicon layer having a plurality of polysilicon grains separated by a distance from adjacent grains and supported by the first polysilicon layer;
   wherein the first polysilicon layer further comprises depressions formed between the grains of the second polysilicon layer.

18. The roughened polysilicon surface of claim 17, wherein the first and second polysilicon layers are formed as a single polysilicon layer.

19. A capacitor, comprising:
   an upper plate;
   a lower plate; and
   a dielectric layer interposed between the upper plate and the lower plate;
   wherein the lower plate comprises:
      a first silicon layer having depressions; and
      a second silicon layer having a plurality of polysilicon grains separated by a distance from adjacent grains and supported by the first silicon layer.

20. The capacitor of claim 19, wherein the first polysilicon layer and the second polysilicon layer are formed as a single deposit of silicon material selected from the group consisting of undoped amorphous silicon, doped amorphous silicon, undoped polysilicon and doped polysilicon.

21. A capacitor, comprising:
   an upper plate;
   a lower plate; and
   a dielectric layer interposed between the upper plate and the lower plate;
   wherein the lower plate comprises:
      a first polysilicon layer having depressions; and
      a second polysilicon layer having a plurality of grains separated by a distance from adjacent grains and supported by the first polysilicon layer.

22. The capacitor of claim 21, wherein the first and second polysilicon layers are formed as a single polysilicon layer.

23. A capacitor, comprising:
   an upper plate;
   a lower plate; and
   a dielectric layer interposed between the upper plate and the lower plate;
   wherein the lower plate comprises:
      a first silicon layer having depressions comprising a silicon material selected from the group consisting of doped amorphous silicon and doped polysilicon; and
      a second silicon layer having a plurality of polysilicon grains separated by a distance from adjacent grains and supported by the first silicon layer.

24. A capacitor, comprising:
   an upper plate;
   a lower plate; and
   a dielectric layer interposed between the upper plate and the lower plate;
   wherein the lower plate comprises:
      a first silicon layer comprising a silicon material selected from the group consisting of doped amorphous silicon and doped polysilicon; and
      a second silicon layer having a plurality of polysilicon grains separated by a distance from adjacent grains and supported by the first silicon layer;
      wherein the first silicon layer further comprises depressions formed between the grains of the second silicon layer.

25. A capacitor, comprising:
   an upper plate;
   a lower plate; and
   a dielectric layer interposed between the upper plate and the lower plate;
   wherein the lower plate comprises:
      a first polysilicon layer having depressions comprising a conductively-doped polysilicon material; and
      a second polysilicon layer having a plurality of polysilicon grains separated by a distance from adjacent grains and supported by the first polysilicon layer.

26. The capacitor of claim 25, wherein the first and second polysilicon layers are formed as a single polysilicon layer.

27. A capacitor, comprising:
   an upper plate;
   a lower plate; and
   a dielectric layer interposed between the upper plate and the lower plate;
   wherein the lower plate comprises:
      a first polysilicon layer comprising a conductively-doped polysilicon material; and
      a second polysilicon layer having a plurality of polysilicon grains separated by a distance from adjacent grains and supported by the first polysilicon layer;
      wherein the first polysilicon layer further comprises depressions formed between the grains of the second polysilicon layer.

28. The capacitor of claim 27, wherein the first and second polysilicon layers are formed as a single polysilicon layer.

29. A capacitor, comprising:

an upper plate;

a lower plate; and a dielectric layer interposed between the upper plate and the lower plate;

wherein the lower plate comprises:
- a doped polysilicon layer; and
- an undoped polysilicon layer having a plurality of polysilicon grains separated by a distance from adjacent grains and supported by the doped polysilicon layer.

30. A capacitor, comprising:

an upper plate;

a lower plate; and a dielectric layer interposed between the upper plate and the lower plate;

wherein the lower plate comprises:
- a doped polysilicon layer; and
- an undoped polysilicon layer having a plurality of polysilicon grains separated by a distance from adjacent grains and supported by the doped polysilicon layer;
- wherein the doped polysilicon layer further comprises depressions formed between the grains of the undoped polysilicon layer.

31. A capacitor, comprising:

an upper plate;

a lower plate comprising a multi-layered polysilicon structure having an undoped polysilicon layer supported by a doped polysilicon layer, wherein the undoped polysilicon layer has a plurality of polysilicon grains, and wherein adjacent grains of the plurality of polysilicon grains are separated by depressions in the doped polysilicon layer; and a dielectric layer interposed between the upper plate and the lower plate.

32. A capacitor, comprising:

an upper plate;

a lower plate having depressions comprising a multi-layered polysilicon structure having a rough polysilicon portion supported by a base polysilicon portion, wherein the rough polysilicon portion has a plurality of polysilicon grains in a spaced-apart relationship from adjacent grains; and a dielectric layer interposed between the upper plate and the lower plate.

33. The capacitor of claim 32, wherein the rough polysilicon portion and the base polysilicon portion are formed as a single layer of polysilicon.

34. A capacitor, comprising:

an upper plate;

a lower plate comprising a multi-layered polysilicon structure having a rough polysilicon portion supported by a base polysilicon portion, wherein the rough polysilicon portion has a plurality of polysilicon grains, and wherein adjacent grains of the plurality of polysilicon grains are separated by depressions in the base polysilicon portion; and a dielectric layer interposed between the upper plate and the lower plate.

35. The capacitor of claim 34, wherein the rough polysilicon portion and the base polysilicon portion are formed as a single layer of polysilicon.

36. A memory device, comprising:

a field effect transistor;

a bit line coupled to the field effect transistor; and a capacitor, wherein the capacitor comprises:
- an upper plate;
- a lower plate coupled to the field effect transistor and comprising:
  - a first silicon layer having depressions; and
  - a second silicon layer having a plurality of polysilicon grains separated by a distance from adjacent grains and supported by the first silicon layer; and
- a dielectric layer interposed between the upper plate and the lower plate.

37. The memory device of claim 36, wherein the first polysilicon layer and the second polysilicon layer are formed as a single deposit of silicon material selected from the group consisting of undoped amorphous silicon, doped amorphous silicon, undoped polysilicon and doped polysilicon.

38. A memory device, comprising:

a field effect transistor;

a bit line coupled to the field effect transistor; and a capacitor, wherein the capacitor comprises:
- an upper plate;
- a lower plate coupled to the field effect transistor and comprising:
  - a first polysilicon layer having depressions; and
  - a second polysilicon layer having a plurality of grains separated by a distance from adjacent grains and supported by the first polysilicon layer; and
- a dielectric layer interposed between the upper plate and the lower plate.

39. The memory device of claim 38, wherein the first polysilicon layer and the second polysilicon layer are formed as a single polysilicon layer.

40. A memory device, comprising:

a field effect transistor;

a bit line coupled to the field effect transistor; and a capacitor, wherein the capacitor comprises:
- an upper plate;
- a lower plate coupled to the field effect transistor and comprising:
  - a first silicon layer having depressions comprising a silicon material selected from the group consisting of doped amorphous silicon and doped polysilicon; and
  - a second silicon layer having a plurality of polysilicon grains separated by a distance from adjacent grains and supported by the first silicon layer; and
- a dielectric layer interposed between the upper plate and the lower plate.

41. The memory device of claim 40, wherein the first and second silicon layers are formed as a single polysilicon layer.

42. A memory device, comprising:

a field effect transistor;

a bit line coupled to the field effect transistor; and a capacitor, wherein the capacitor comprises:
- an upper plate;
- a lower plate coupled to the field effect transistor and comprising:
  - a first silicon layer comprising a silicon material selected from the group consisting of doped amorphous silicon and doped polysilicon; and a second silicon layer having a plurality of polysilicon grains separated by a distance from adjacent grains and supported by the first silicon layer;
wherein the first silicon layer further comprises depressions formed between the grains of the second silicon layer; and
a dielectric layer interposed between the upper plate and the lower plate.

43. The memory device of claim 42, wherein the first and second silicon layers are formed as a single layer.

44. A memory device, comprising:
a field effect transistor;
a bit line coupled to the field effect transistor; and
a capacitor, wherein the capacitor comprises:
an upper plate;
a lower plate coupled to the field effect transistor and comprising:
a first polysilicon layer having depressions comprising a conductively-doped polysilicon material; and
a second polysilicon layer having a plurality of polysilicon grains separated by a distance from adjacent grains and supported by the first polysilicon layer; and
a dielectric layer interposed between the upper plate and the lower plate.

45. The memory device of claim 44, wherein the first and second polysilicon layers are formed as a single polysilicon layer.

46. A memory device, comprising:
a field effect transistor;
a bit line coupled to the field effect transistor; and
a capacitor, wherein the capacitor comprises:
an upper plate;
a lower plate coupled to the field effect transistor and comprising:
a first polysilicon layer comprising a conductively-doped polysilicon material; and
a second polysilicon layer having a plurality of polysilicon grains separated by a distance from adjacent grains and supported by the first polysilicon layer;
wherein the first polysilicon layer further comprises depressions formed between the grains of the second polysilicon layer; and
a dielectric layer interposed between the upper plate and the lower plate.

47. The memory device of claim 46, wherein the first and second polysilicon layers are formed as a single polysilicon layer.

48. A memory device, comprising:
a field effect transistor;
a bit line coupled to the field effect transistor, and
a capacitor, wherein the capacitor comprises:
an upper plate;
a lower plate coupled to the field effect transistor, wherein the lower plate comprises:
a doped polysilicon layer, and
an undoped polysilicon layer having a plurality of polysilicon grains separated by a distance from adjacent grains and supported by the doped polysilicon layer;
wherein the doped polysilicon layer further comprises depressions formed between the grains of the undoped polysilicon layer; and
a dielectric layer interposed between the upper plate and the lower plate.

49. The memory device of claim 48, wherein the first and second polysilicon layers are formed as a single polysilicon layer.

50. A memory device, comprising:
a field effect transistor;
a bit line coupled to the field effect transistor; and
a capacitor, wherein the capacitor comprises:
an upper plate;
a lower plate coupled to the field effect transistor and comprising a multi-layered polysilicon structure having an undoped polysilicon layer supported by a doped polysilicon layer, wherein the undoped polysilicon layer has a plurality of polysilicon grains, and wherein adjacent grains of the plurality of polysilicon grains are separated by depressions in the doped polysilicon layer; and
a dielectric layer interposed between the upper plate and the lower plate.

51. A memory device, comprising:
a field effect transistor;
a bit line coupled to the field effect transistor, and
a capacitor, wherein the capacitor comprises:
an upper plate;
a lower plate comprising a multi-layered polysilicon structure having a rough polysilicon portion supported by a base polysilicon portion having depressions, wherein the rough polysilicon portion has a plurality of polysilicon grains in a spaced-apart relationship from adjacent grains; and
a dielectric layer interposed between the upper plate and the lower plate.

52. The memory device of claim 51, wherein the rough polysilicon portion and the base polysilicon portion are formed as a single layer of polysilicon.

53. A memory device, comprising:
a field effect transistor;
a bit line coupled to the field effect transistor; and
a capacitor, wherein the capacitor comprises:
an upper plate;
a lower plate comprising a multi-layered polysilicon structure having a rough polysilicon portion supported by a base polysilicon portion, wherein the rough polysilicon portion has a plurality of polysilicon grains, and wherein adjacent grains of the plurality of polysilicon grains are separated by depressions in the base polysilicon portion; and
a dielectric layer interposed between the upper plate and the lower plate.

54. The memory device of claim 53, wherein the rough polysilicon portion and the base polysilicon portion are formed as a single layer of polysilicon.

* * * * *